United States Patent
Brody et al.

(10) Patent No.: US 6,631,675 B2
(45) Date of Patent: Oct. 14, 2003

(54) SCREENING METHOD FOR DOUBLE PASS SCREENING

(75) Inventors: Jeffrey A. Brody, Hopewell Junction, NY (US); Harry D. Cox, Rifton, NY (US); John J. Garant, Hopewell Junction, NY (US); Dinesh Gupta, Hopewell Junction, NY (US); Dale W. Snowdon, Pawling, NY (US)

(73) Assignee: International Business Machines Corporation, Armonk, NY (US)

(*) Notice: Subject to any disclaimer, the term of this patent is extended or adjusted under 35 U.S.C. 154(b) by 84 days.

(21) Appl. No.: 09/845,070

(22) Filed: Apr. 27, 2001

(65) Prior Publication Data

US 2002/0157546 A1 Oct. 31, 2002

(51) Int. Cl.$^7$ .................................................. B41M 1/12
(52) U.S. Cl. ........................ 101/129; 101/127; 427/282
(58) Field of Search .................. 101/115, 123, 101/127, 128.4, 129; 118/213, 406; 427/96, 97, 282, 404, 409

(56) References Cited

U.S. PATENT DOCUMENTS

| | | | |
|---|---|---|---|
| 5,249,255 A | * 9/1993 | Fuqua et al. | 392/412 |
| 5,498,575 A | * 3/1996 | Onishi et al. | 228/180.21 |
| 5,740,730 A | * 4/1998 | Thompson, Sr. | 101/127 |
| 5,792,293 A | 8/1998 | Inasaka | |
| 5,819,652 A | 10/1998 | Utter et al. | |
| 5,825,629 A | * 10/1998 | Hoebener et al. | 361/777 |
| 6,095,041 A | 8/2000 | Comino et al. | |

* cited by examiner

Primary Examiner—Ren Yan
(74) Attorney, Agent, or Firm—Ira D. Blecker

(57) ABSTRACT

A screening mask for screening an article, the screening mask including a screening mask body having a screening side and a nonscreening side, an one opening through the mask for screening at least one feature from the screening side to the nonscreening side, and a blind opening for protecting a previously screened feature. The blind opening is blocked on the screening side and open on the nonscreening side. The screening mask is used in double pass screening so that a second feature may be formed on the article without damaging a previously formed feature.

8 Claims, 2 Drawing Sheets

SCREENING METHOD FOR DOUBLE PASS SCREENING

BACKGROUND OF THE INVENTION

The present invention relates to a mask for screening conductive patterns on substrates, and more particularly, relates to a mask and screening method for double pass screening of conductive patterns on substrates.

In the fabrication of packages for semiconductor devices and the like, it is necessary to deposit finely detailed patterns of conductive material on insulative substrates such as those made from ceramic materials. In order to provide these conductive patterns, conductive paste is deposited on the insulative substrate through a screening mask.

Screening masks are typically made of a metallic material such as molybdenum, copper, nickel and the like. However, the material of the screening mask is not important to the present invention.

The conductive patterns typically consist of wiring lines and vias. In one method of screening, the wiring lines and vias are deposited at the same time through a single screening mask. This method of screening is called single pass In another method of screening, the wiring lines and vias are deposited at two different times through two different screening masks. This method of screening is called double pass screening. That is, the first pass fills the vias, and sometimes also deposits a via cap, while the second pass deposits the surface wiring lines. The greensheets are typically dried between screening passes which may lead to some distortion in the greensheets so that the first-deposited pattern is slightly off from ideal. Then, when the mask for the second pass is applied, the mask can cause damage to the first-deposited pattern. This damage can cause poor yields due to shorts or extraneous metal.

Utter et al. U.S. Pat. No. 5,819,652 discloses a conventional screening mask for screening wiring lines and vias in a single pass.

Conventional double pass screening is disclosed in Inasaka U.S. Pat. No. 5,792,293, the disclosure of which is incorporated by reference herein. As shown in FIGS. 6 and 7 of Inasaka, vias are first screened followed by screening of the conductor pattern. This reference does not disclose the masks used during the first and second screening passes.

A conventional screening mask is disclosed in Comino et al. U.S. Pat. No. 6,095,041, the disclosure of which is incorporated by reference herein. As can be seen in FIG. 1 of the reference, the screening mask is principally open for screening of features except for tabs bridging the open features so as to provide structural rigidity to the screening mask.

Notwithstanding these advances in the art, there remains a need for a screening mask and screening method suitable for double pass screening which will not damage a previously deposited pattern.

Accordingly, it is a purpose of the present invention to have a screening mask and screening method for double pass screening which will not damage a previously deposited pattern.

It is another purpose of the present invention to have a screening mask for double pass screening that can be easily manufactured and a screening method for double pass screening that can be easily implemented.

These and other purposes of the present invention will become more apparent after referring to the following description considered in conjunction with the accompanying drawings.

BRIEF SUMMARY OF THE INVENTION

The purposes of the present invention have been achieved by providing, according to a first aspect of the present invention, a method of double-pass screening an article, the method comprising the steps of:

applying a first mask and screening through the first mask a first feature with respect to the article;

removing the first mask; and applying a second mask and screening through the second mask a second feature with respect to the article, the second mask having no opening directly over the first feature.

According to a second aspect of the invention, there is provided a method of double-pass screening a ceramic greensheet, the method comprising the steps of:

applying a first mask and screening through the first mask at least one via in the ceramic greensheet; removing the first mask; and applying a second mask and screening through the second mask at least one wiring line on the ceramic greensheet, the second mask having no opening directly over the at least one via.

According to a third aspect of the invention, there is provided a screening mask for screening an article, the screening mask comprising:

a screening mask body having a screening side and a nonscreening side;

at least one opening through the mask for screening at least one feature from the screening side to the nonscreening side; and at least one blind opening for protecting a previously screened featured, the blind opening blocked on the screening side and open on the nonscreening side.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
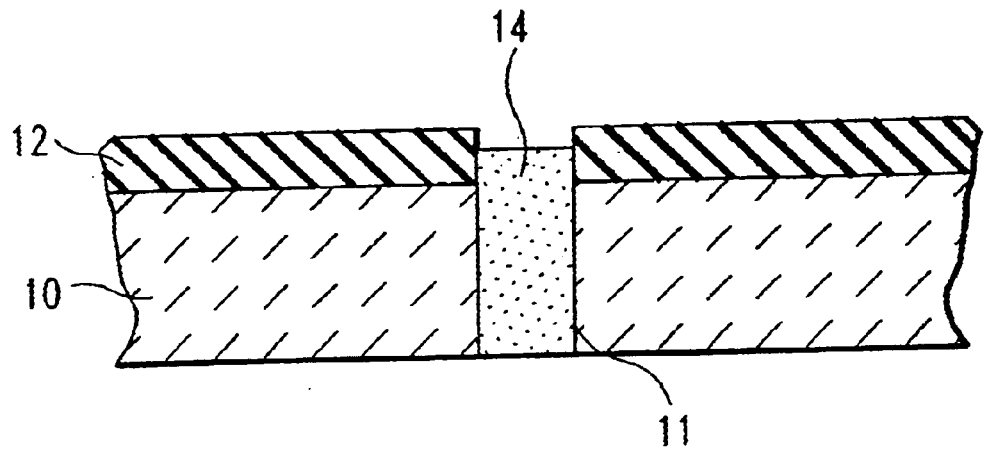
FIG. 1 is a cross sectional view of a ceramic greensheet having a first feature screened with a first screening mask.

Referring to the Figures in more detail, and particularly referring to FIG. 1, there is shown an article 10 having a first feature 11 which has been screened through a screening mask 12 with a material 14. Screening mask 12 may be any conventional screening mask. As shown in FIG. 1, screening mask 12 is made of a metallic material.

It may be desirable to be able to form a second feature on article 10 which connects to the first feature 11. Because the deposited materials for the first and second features may be of different composition or for some other reason, it is preferred to screen the first feature 11 with a first mask 12, as shown in FIG. 1, and then screen a second feature with a second mask, as shown in FIG. 2.

Before the second feature is screened, the first mask 12 is removed from article 10, leaving filled first feature 11 in place in article 10. First mask 12 may be cleaned for reuse later on or otherwise disposed of. Article 10 having filled first feature 11 may be dried in an oven or other suitable apparatus if desired prior to screening of the second feature.

Figure 2:
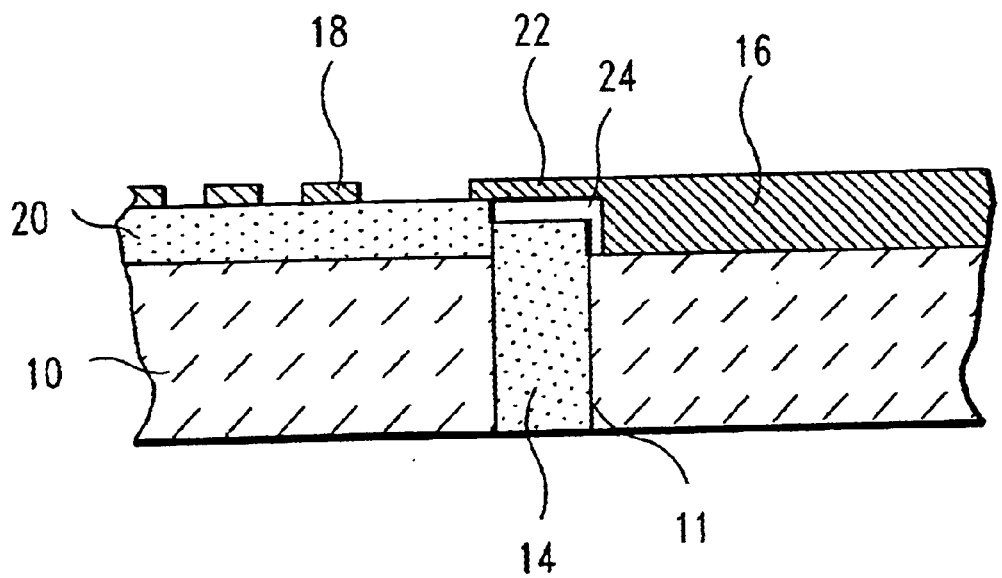
FIG. 2 is a cross sectional view of the ceramic greensheet of FIG. 1 having a second feature screened with a second screening mask which protects the first feature screened.
Figure 3:
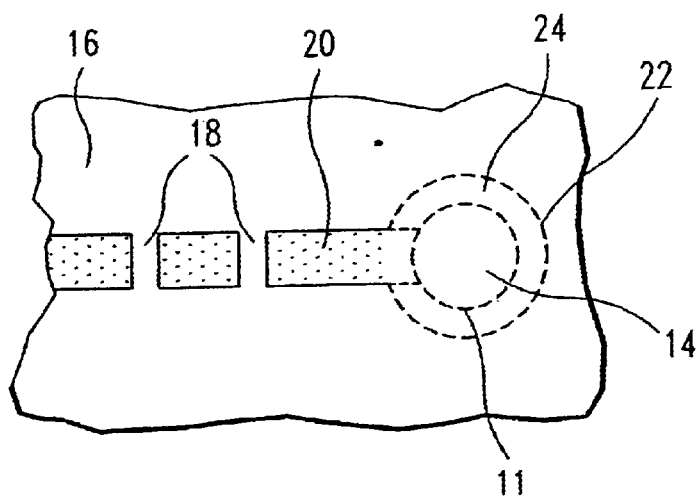
FIG. 3 is a top view of the ceramic greensheet and second screening mask shown in FIG. 2.

Referring now to FIGS. 2 and 3, a second mask 16 is placed on article 10. To avoid any damage to filled first feature 11, the mask 16 has a relieved or blind area 22 over filled first feature 11 so that when the second mask 16 is placed on the article 10, the mask 16 does not contact the filled first feature 11. The relieved or blind area 22 will usually have a clearance 24 so that the second mask 16 does not contact the filled first feature 11 in any way. Second mask 16 may also have conventional tabs 18 which provide structural rigidity to the mask when there are long open areas in the mask.

A second feature 20 is then screened through second mask 16. Second feature 20 is designed to contact filled first feature 11. Second mask 16 would then be removed and cleaned or disposed of as required.

Because second mask 16 has relieved or blind area 22, filled first feature 11 was not damaged during the placement of the second mask 16. Then, after screening of the second feature 20, the screening pattern is complete without shorts or other extraneous material that would occur with prior art screening masks. In the prior art method of double pass screening, the yield after the second screening was 2% at electrical test and 20% at layer inspection. It has been found that, according to the present invention, the yield after electrical test has increased to 50% and the yield after layer inspection has increased to 80%.

Figure 4:
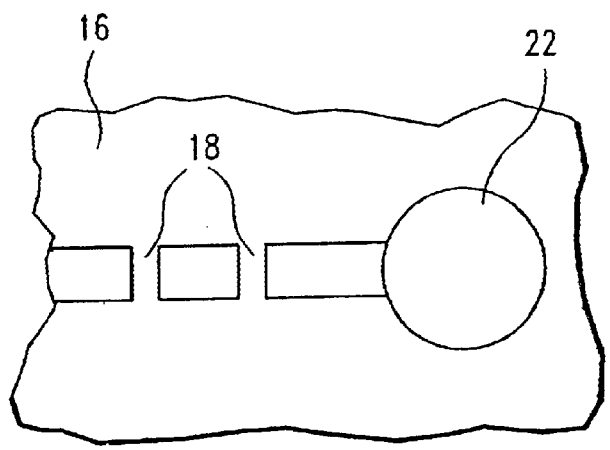
FIG. 4 is a bottom view of the second screening mask (removed from the ceramic greensheet of FIG. 2).

Referring now to FIG. 4, the bottom side of the second mask 16 having relieved or blind area 22 is clearly shown.

Figure 5:
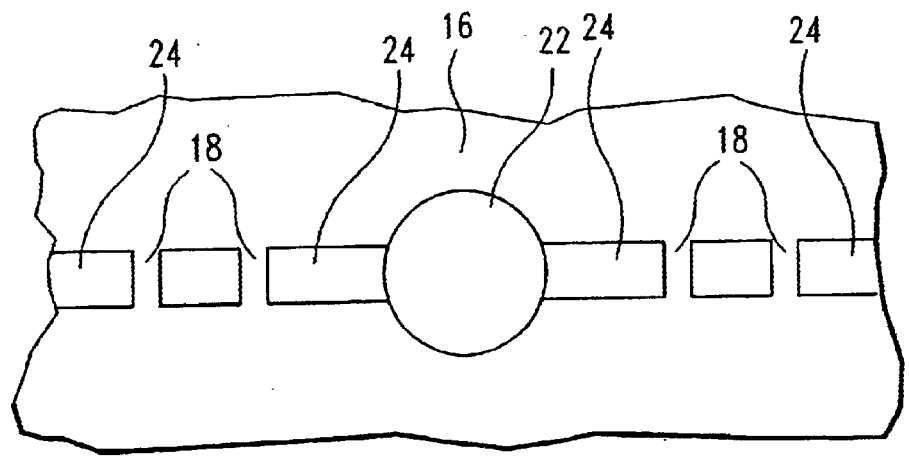
FIG. 5 is a bottom view of a second embodiment of the second screening mask.

In the embodiment shown in FIGS. 1 to 4, the second feature 20 ends at filled first feature 11. It is also within the scope of the present invention for the second feature to continue beyond filled first feature 11. This embodiment is shown in FIG. 5 where the open areas 24 for screening a second feature 20 continue on either side of relieved or blind area 22.

It should be understood that the present invention has broad applicability to a number of screening applications. However, the preferred application of the present invention is for the double pass screening of conductive patterns on ceramic substrates, most preferably ceramic greensheets. First feature 11 preferably is a via or a contact pad while second feature 20 is preferably a wiring line.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method of double-pass screening an article, the method comprising the steps of:

applying a first mask and screening through the first mask a first feature with respect to the article;

removing the first mask;

applying a second mask having a recessed blind opening directly over the first feature so that when applying the second mask, the first feature is within the recessed blind opening and is not contacted by the second mask; and screening through the second mask a second feature with respect to the article, the second feature not being screened through the recessed blind opening, wherein the second feature directly contacts the first feature.

2. The method of claim 1 wherein the article is a ceramic greensheet, the first feature comprises a via and the second feature comprises a wiring line.

3. The method of claim 1 further comprising the step, between the step of removing the first mask and applying a second mask, of drying the article.

4. The method of claim 1 wherein the second mask comprises a wall having an opening for communication with the recessed blind opening so that during the step of screening through the second mask a second feature, the second feature directly contacts the first feature through the wall opening.

5. A method of double-pass screening a ceramic greensheet, the method comprising the steps of:

applying a first mask and screening through the first mask at least one via in the ceramic greensheet;

removing the first mask;

applying a second mask having a recessed blind opening directly over the at least one via so that when applying the second mask, the at least one via is within the recessed blind opening and is not contacted by the second mask; and screening through the second mask at least one wiring line on the ceramic greensheet, the wiring line not being screened through the recessed blind opening, wherein the at least one wiring line directly contacts the at least one via.

6. The method of claim 5 further comprising the step, between the step of removing the first mask and applying a second mask, of drying the ceramic greensheet.

7. The method of claim 5 wherein there are a plurality of vias and a plurality of wiring lines.

8. The method of claim 5 wherein the second mask comprises a wall having an opening for communication with the recessed blind opening so that during the step of screening through the second mask at least one wiring line, the at least one wiring line directly contacts the at least one via through the wall opening.

* * * * *